(12) United States Patent
Yeo et al.

(10) Patent No.: US 7,002,638 B2
(45) Date of Patent: Feb. 21, 2006

(54) AUTOMATIC GAIN CONTROL

(75) Inventors: Alan Chin Leong Yeo, Singapore (SG);
Kam Choon Kwong, Singapore (SG);
Mieu Ngan Pang, Singapore (SG);
Hwee Bun Tan, Johore (MY)

(73) Assignee: Koninklijke Philips Electronics N.V., Eindhoven (NL)

( * ) Notice: Subject to any disclaimer, the term of this patent is extended or adjusted under 35 U.S.C. 154(b) by 517 days.

(21) Appl. No.: 09/958,130

(22) PCT Filed: Feb. 7, 2001

(86) PCT No.: PCT/EP01/01277

§ 371 (c)(1),
(2), (4) Date: Oct. 4, 2001

(87) PCT Pub. No.: WO01/60056

PCT Pub. Date: Aug. 16, 2001

(65) Prior Publication Data
US 2002/0158992 A1 Oct. 31, 2002

(30) Foreign Application Priority Data
Feb. 8, 2000 (WO) .............. PCT/SG00/00018
Mar. 27, 2000 (SG) .................. 200001748

(51) Int. Cl.
*H04N 5/52* (2006.01)
*H04N 5/50* (2006.01)
(52) U.S. Cl. .................. 348/729; 348/731; 348/678; 348/738

(58) Field of Classification Search ............... 348/729, 348/731, 738, 735, 736, 737, 255, 678, 462, 348/484, 725, 723; 455/136, 239.1, 138, 455/247.1, 240.1, 250.1, 245.1, 164.2; 330/75, 330/100; 334/12, 16, 18, 26
See application file for complete search history.

(56) References Cited

U.S. PATENT DOCUMENTS

| 3,254,155 | A | * | 5/1966 | Di Nardo ................ 348/736 |
| 4,406,019 | A | * | 9/1983 | Ide et al. .............. 455/245.1 |
| 4,580,288 | A | * | 4/1986 | Rinderle .............. 455/234.2 |
| 4,630,117 | A | * | 12/1986 | Parker .................... 348/678 |
| 4,736,456 | A | * | 4/1988 | Maier .................. 455/164.2 |

(Continued)

FOREIGN PATENT DOCUMENTS

WO          WO 9406244       3/1994

*Primary Examiner*—John Miller
*Assistant Examiner*—Jean W. Désir

(57) ABSTRACT

In a method of automatic gain control for both TV and FM radio signals, the TV and FM radio signals are controllably amplified (AGC-AMP) to obtain amplifier output signals, the amplifier output signals are tuner processed (F, MIX, IF-AMP) to obtain tuner output signals, the tuner output signals are applied as control signals (T-AGC) to the controllable amplifier (AGC-AMP), a bandwidth of a thus formed AGC loop being wide enough for a TV channel, and the tuner output signals are narrow-band filtered (CF) to obtain narrow-band filtered signals having a bandwidth substantially corresponding to a bandwidth of an FM radio channel.

12 Claims, 2 Drawing Sheets

U.S. PATENT DOCUMENTS

Figure 1:
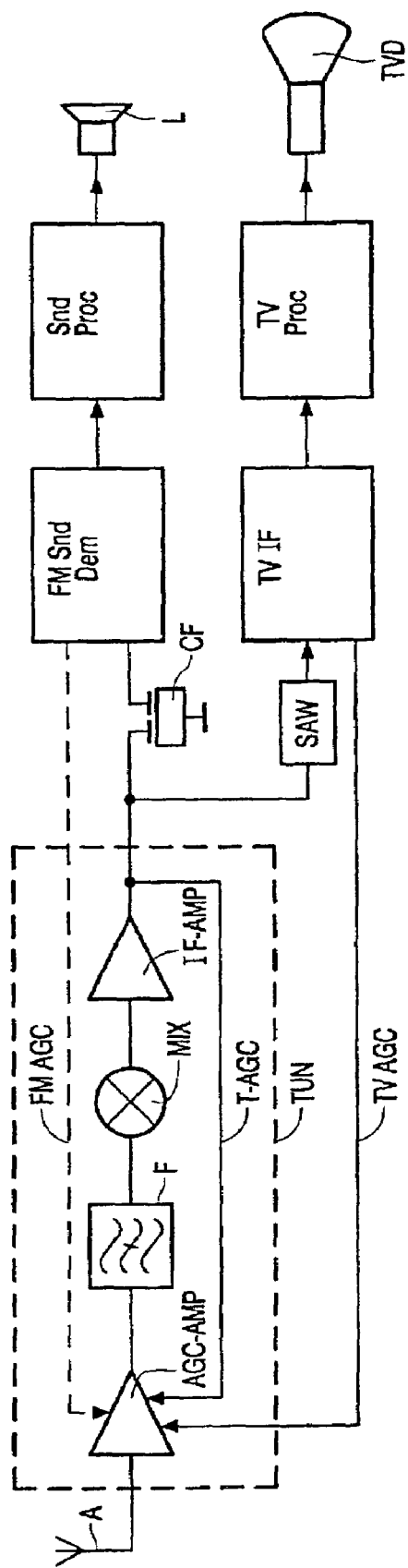

| | | | |
|---|---|---|---|
| 4,974,087 A * | 11/1990 | Rumreich | 348/738 |
| 5,144,439 A | 9/1992 | Wignot | 358/188 |
| 5,175,883 A * | 12/1992 | Ueno | 455/242.2 |
| 5,710,993 A * | 1/1998 | Brekelmans | 455/188.1 |
| 5,732,342 A * | 3/1998 | Roth et al. | 455/234.1 |
| 5,737,033 A * | 4/1998 | Masuda | 348/678 |
| 5,809,407 A * | 9/1998 | Kasperkovitz et al. | 455/184.1 |
| 5,940,143 A * | 8/1999 | Igarashi et al. | 348/678 |
| 5,950,112 A * | 9/1999 | Hori et al. | 725/148 |
| 5,953,636 A * | 9/1999 | Keate et al. | 455/3.02 |
| 5,995,169 A * | 11/1999 | Hatano | 348/726 |
| 6,037,999 A * | 3/2000 | Kunishima | 348/731 |
| 6,239,848 B1 * | 5/2001 | Mycynek et al. | 348/678 |
| 6,333,765 B1 * | 12/2001 | Okada et al. | 348/678 |
| 6,459,458 B1 * | 10/2002 | Balaban | 348/678 |
| 6,542,203 B1 * | 4/2003 | Shadwell et al. | 348/726 |

* cited by examiner

AUTOMATIC GAIN CONTROL

The invention relates to a method and device for automatic gain control in receivers for both TV and FM radio.

WOA-94/06244 discloses a variable gain amplifier. Front-end portions of television receivers or video tape recorders are described, each of which uses separate intermediate-frequency (IF) amplifiers for the FM sound carrier and vestigial AM picture carrier. In each front end, the two IF amplifiers comprise matched cascade connections of the variable gain amplifiers with tracking automatic gain control (AGC). The AGC signals are generated by an AGC detector supplied composite video signal from a video detector, which video detector responds to amplified IF signal supplied by the IF amplifier for the vestigial AM picture carrier. This apparatus is not suitable for a receiver for both TV and FM radio, as in FM radio receipt mode the video detector does not receive TV signals on which AGC control signals can be based.

U.S. Pat. No. 5,144,439 discloses a mono FM radio in a television receiver which includes a single tuner for tuning both television signals and broadcast FM stations. The tuner is operated at a fixed gain setting in FM reception mode.

It is, inter alia, an object of the invention to provide an automatic gain control for both TV reception and FM radio reception. To this end, the invention provides an automatic gain control as defined in the independent claims. Advantageous embodiments are defined in the dependent claims.

In a method of automatic gain control for both TV and FM radio signals, the TV and FM radio signals are controllably amplified to obtain amplifier output signals, the amplifier output signals are tuner processed to obtain tuner output signals, the tuner output signals are applied as control signals to the controllable amplifier, a bandwidth of a thus formed AGC loop being wide enough for a TV channel, and the tuner output signals are narrow-band filtered to obtain narrow-band filtered signals having a bandwidth substantially corresponding to a bandwidth of an FM radio channel.

Figure 2:
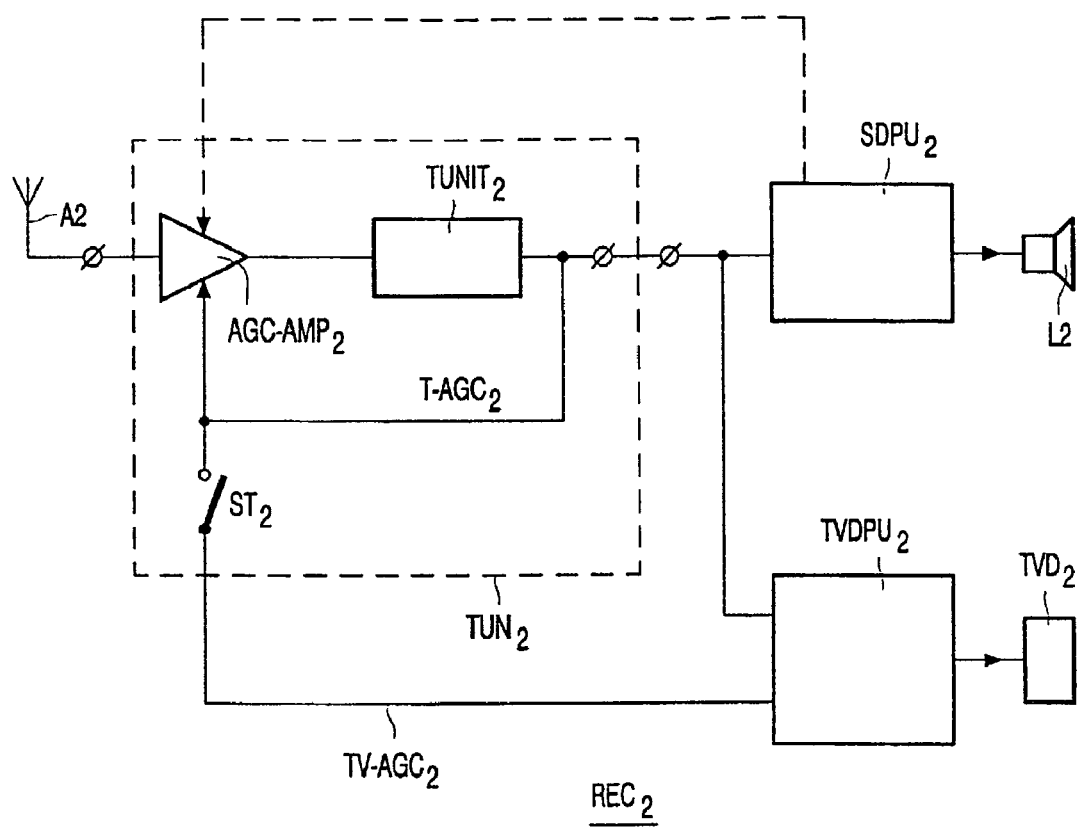

These and other aspects of the invention will be apparent from and elucidated with reference to the embodiments described hereinafter. Herein shows:

FIG. 1 an embodiment of a receiver in accordance with the present invention, and FIG. 2 a second embodiment of a receiver in accordance with the present invention.

In the drawing, antenna signals from an antenna A are applied to an AGC amplifier AGC-AMP, the output of which is applied to a cascade connection of an IF filter F, a mixer MIX and an IF amplifier IF-AMP. An output of the IF amplifier IF-AMP is applied to a ceramic filter CF having an output connected to an FM sound demodulator IC FM Snd Dem. A sound processor Snd Proc processes output signals of the FM sound demodulator IC FM Snd Dem to furnish (stereo) load-speaker signals to load-speakers L. The output of the IF amplifier IF-AMP is also applied to a surface acoustic wave filter SAW having an output that is connected to a TV IF IC. A TV processor TV Proc processes output signals of the TV IF IC to furnish (color) image signals to a TV display TVD.

The output of the IF amplifier IF-AMP is fed back to the AGC amplifier AGC as a tuner-internal AGC signal T-AGC. Optionally, a conventional AGC signal TV-AGC from the TV IF IC is also applied as a control signal to the AGC amplifier AGC. Optionally, an FM AGC signal from the FM sound processor IC FM Snd Proc is also applied as a control signal to the AGC amplifier AGC.

During FM radio reception, protection of the mixer MIX and IF amplifier IF-AMP is needed is needed because of the varying strength and proximity of adjacent FM channels. Adjacent FM channels are 200 kHz apart as compared to 6, 7 or 8 MHz for TV. Since the RF bandwidth during FM reception is in the order of a few MHz, a wide-band predetermined AGC or software-selectable AGC is provided. The bandwidth of this wide-band AGC is wide enough to cope with TV signals (intended for the TV IF IC). This wide-band AGC peeks at the IF before the ceramic filter CF that has a typical bandwidth of 200 kHz and based on a predetermined level decides to act or not. This prevents the tuner stages from overloading.

The proposed tuner-internal wide-band AGC can be used together with the conventional TV AGC or instead of the conventional TV AGC.

FIG. 2 shows a second embodiment of a receiver REC2 in accordance with the present invention. The same elements as in FIG. 1 are denoted with corresponding reference numerals.

Antenna signals from an antenna A2 are applied to an AGC amplifier AGC-AMP2, the output of which is applied to a tuner unit TUNIT2. The tuner unit TUNIT2 comprises for example the IF filter, mixer and IF amplifier as shown in FIG. 1. The output of the tuner unit TUNIT2 is coupled to the output of the tuner TUN2 for supplying to both the sound demodulation and processing unit SDPU2 and the TV demodulation and processing unit TVDPU2 the output signals.

These two units are only given block schematic and can for example comprise the same elements as the corresponding parts in FIG. 1. The output of the sound demodulation and processing unit SDPU2 is coupled to loudspeakers L2 and the output of the TV demodulation and processing unit TVDPU2 is coupled to a TV display TVD2.

The TV demodulation and processing unit TVDPU2 comprises further a control output for supplying a control signal TVAGC2 corresponding to the control signal as described in relation to FIG. 1. This control signal is supplied to the tuner TUN2 to be a control signal for the AGC amplifier AGC-AMP2. The AGC amplifier further receives an internal control signal TAGC2 which is the same or corresponding as in FIG. 1.

The difference with the tuner of this figure and the tuner TUN of FIG. 1 is that the control signal from the TV demodulation and processing unit TVDPU2 is now supplied to the AGC amplifier AGC-AMP2 via switching means ST2. This switching means are controlled in such a way that during reception of FM radio signals the switch is open and during receiving TV signals switch is closed. In this way the undefinable output signal of the TV demodulation and processing unit TVDPU2 during reception of FM radio signals have no influence on the AGC amplifier AGC-AMP2. In this way the operation of the tuner and that of the receiver is further improved.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements, and by means of a suitably programmed computer. In the device claim enumerating several means, several of these means can be embodied by one and the same item of hardware. The mere fact that certain measures are recited in mutually different dependent claims does not indicate that a combination of these measures cannot be used to advantage.

What is claimed is:

1. A method of automatic gain control for both TV and FM radio signals, comprising:
controllably amplifying the TV and FM radio signals to provide amplifier output signals;
tuner processing the amplifier output signals to provide tuner output signals;
applying the tuner output signals as control signals for controllably amplifying the TV and FM radio signals, a bandwidth of a thus formed AGC loop being wide enough for a TV channel; and
IF processing the tuner output signals to obtain further control signals for controllably amplifying the TV and FM radio signals.

2. A method of automatic gain control for both TV and FM radio signals, comprising:
controllably amplifying the TV and FM radio signals to provide amplifier output signals;
tuner processing the amplifier output signals to provide tuner output signals;
applying the tuner output signals as control signals for controllably amplifying the TV and FM radio signals, a bandwidth of a thus formed AGC loop being wide enough for a TV channel;
IF processing the tuner output signals to obtain further control signals for controllably amplifying the IV and FM radio signals; and
selectively coupling the further control signals for controllably amplifying the TV and FM radio signals.

3. A method of automatic gain control for both TV and FM radio signals, comprising:
controllably amplifying the TV and FM radio signals to provide amplifier output signals;
tuner processing the amplifier output signals to provide tuner output signals;
applying the tuner output signals as control signals for controllably amplifying the TV and FM radio signals, a bandwidth of a thus formed AGC loop being wide enough for a TV channel;
narrow-band filtering the tuner output signals to obtain narrow-band filtered signals having a bandwidth substantially corresponding to a bandwidth of an FM radio channel; and
FM demodulating the tuner output signals to obtain further control signals for controllably amplifying the TV and FM radio signals.

4. The method of claim 3, including
selectively coupling the further control signals for controllably amplifying the TV and FM radio signals.

5. The method of claim 3, including
IF processing the tuner output signals to obtain other control signals for controllably amplifying the TV and FM radio signals.

6. The method of claim 5, including
selectively coupling the other control signals for controllably amplifying the TV and FM radio signals.

7. A receiving apparatus for both TV and FM radio signals, comprising:
a controllable amplifier for the TV and FM radio signals that is configured to provide amplifier output signals;
a tuner that is configured to process the amplifier output signals to provide tuner output signals, wherein the tuner output signals are operably coupled as control signals to the controllable am lifter a bandwidth of a thus formed AGC loop being wide eunuch for a TV channel; and
an IF stage that is configured to process the tuner output signals to provide further control signals for the controllable amplifier.

8. The receiving apparatus of claim 7 including:
a narrow-band filter for the tuner output signals that is configured to provide narrow-band filtered signals having a bandwidth substantially corresponding to a bandwidth of an FM radio channel,
FM sound processing circuitry that is configured to provide loud-speaker signals from the obtain narrow-band filtered signals; and
image signal processing circuitry that is configured to provide display signals from the tuner output signals.

9. A display apparatus comprising:
the receiving apparatus of claim 7; and
an image display that is configured to display the display signals.

10. A receiving apparatus for both TV and FM radio signals, comprising:
a device that includes:
a controllable amplifier for the TV and FM radio signals that is configured to provide amplifier output signals; and
a tuner that is configured to process the amplifier output signals to provide tuner output signals; wherein the tuner output signals are operably coupled as control signals to the controllable amplifier, a bandwidth of a thus formed AGC loop being wide enough for a TV channel;
an IF stage that is configured to process the tuner output signals to provide further control signals for the controllable amplifier; and
a switch that is configured to selectively couple the further control signals to the controllable amplifier.

11. The receiving apparatus of claim 10, including:
a narrow-band filter for the tuner output signals that is configured to provide narrow-band filtered signals having a bandwidth substantially corresponding to a bandwidth of an FM radio channel,
FM sound processing circuitry that is configured to provide loud-speaker signals from the obtain narrow-band filtered signals; and
image signal processing circuitry that is configured to provide display signals from the tuner output signals.

12. A display apparatus comprising:
the receiving apparatus of claim 10; and
an image display that is configured to display the display signals.

* * * * *